United States Patent
Johnson et al.

(10) Patent No.: US 6,774,009 B1
(45) Date of Patent: Aug. 10, 2004

(54) SILICON TARGET ASSEMBLY

(75) Inventors: Christopher A. Johnson, Albuquerque, NM (US); James W. Ridout, Albuquerque, NM (US); George M. Wityak, Albuquerque, NM (US)

(73) Assignee: Academy Corporation, Albuquerque, NM (US)

( * ) Notice: Subject to any disclaimer, the term of this patent is extended or adjusted under 35 U.S.C. 154(b) by 92 days.

(21) Appl. No.: 10/108,930

(22) Filed: Mar. 27, 2002

Related U.S. Application Data

(60) Provisional application No. 60/279,202, filed on Mar. 27, 2001.

(51) Int. Cl.[7] ............................................. H01L 21/46
(52) U.S. Cl. ........................... 438/455; 438/3; 438/482; 438/486; 438/150; 438/151; 438/164; 438/166
(58) Field of Search ........................... 438/455, 3, 785, 438/225, 166, 150, 151, 479, 482, 486, 164

(56) References Cited

U.S. PATENT DOCUMENTS

| | | | | |
|---|---|---|---|---|
| 6,073,830 A | * | 6/2000 | Hunt et al. | 228/203 |
| 6,074,279 A | * | 6/2000 | Yoshimura et al. | 451/37 |
| 6,129,787 A | * | 10/2000 | Adachi et al. | 117/89 |

* cited by examiner

Primary Examiner—Matthew Smith
Assistant Examiner—Igwe U. Anya
(74) Attorney, Agent, or Firm—Deborah A. Peacock; Katy C. Fain; Peacock Myers & Adams, PC

(57) ABSTRACT

A target-backing plate assembly for use in physical vapor deposition (PVD) processes. The lower curved surface of the target of the assembly is received in a conformingly-shaped backing plate, while a planar upper surface is presented for PVD. The shape of the target increases the amount of material dissipated and the quality of the film and reduces the amount of necessary machining in production.

21 Claims, 2 Drawing Sheets

SILICON TARGET ASSEMBLY

CROSS-REFERENCE TO RELATED APPLICATIONS

This application claims the benefit of the filing of U.S. Provisional Patent Application Serial No. 60/279,202 entitled "Silicon Target Assembly", filled on Mar. 27, 2001, and the specification thereof is incorporated herein by reference.

BACKGROUND OF THE INVENTION

1. Field of the Invention (Technical Field)

The present invention relates to targets for physical vapor deposition and similar processes, specifically to target-backing plate assemblies and methods of manufacturing the same.

2. Background Art

Physical Vapor Deposition

Physical Vapor Deposition (PVD) and similar deposition processes are used for fabrication of thin film materials, such as, but not limited to, fabrication of thin films for "compact discs" (CDs) or coatings in the semiconductor industry. Specifically, sputtering processes are often preferably involved in the coating of a semiconductor wafer or other substrate mounted within a processing chamber (a.k.a. (deposition chamber"). Silicon is a preferred source material for use as a thin film in elemental and compound compositions. Much of the current application for silicon in thin films is for information display and digital storage media.

PVD and similar processes form a layer of material (coating) on a substrate surface, typically between approximately 2 microns and approximately 5 microns thick. The generic PVD process involves first removing atoms from a source, often referred to as a "target" (a first condensed phase comprising a solid or a liquid), converting them into a gas or vapor form, and then depositing these atoms through condensation on a substrate material (second condensed phase).

For example, in a typical PVD process a substrate (a.k.a. workpiece) is placed in a vacuum chamber and a very high vacuum is drawn. The vacuum chamber space is heated to between approximately 400° F. and approximately 900° F., depending on the specific process. (Where plasma etching is to be used. Plasma is created from an inert gas such as argon to further clean the surface of the workpiece.) Next, the source or coating metal is forced into a gas or vapor phase which is directed at a substrate to be coated. The particles condense on the substrate forming a film.

Forcing Atoms From A Target

Three methods of forcing a source metal, alloy or other compound (such as silicon) from a target are commonly used: evaporation, sputtering, and ion plating.

Evaporation comprises use of a high-current electron beam or resistive heaters to evaporate source material from, for example, a crucible. The evaporated material forms a cloud that fills the deposition chamber and then condenses onto the substrate to produce the desired film. In such a process, atoms take on a relatively low energy state (0.2 to 0.6 eV) and the deposited films, as a result, are not excessively adherent or dense. In some instances, deposition of a substantially uniform coating may require complex rotation of the substrate since the vapor flux may be localized and directional.

In a sputtering process, the surface of the source/target material is bombarded with energetic ions, usually in an ionized inert gas environment comprising, for example, argon. The physical erosion of atoms from the coating material that results from this bombardment is known as sputtering. The substrate is positioned to intercept the flux of displaced or sputtered atoms from the target. Sputtering deposits atoms with energies in the range of 4.0 to 10.0 eV onto a substrate. Of course, it may be possible to "bend" the line-of-sight through application of electromagnetic and/or other energy. Sputtering is, in general, more controllable than evaporation.

The third method of forcing is ion plating, which can produce superior coating adhesion by bombarding the substrate with energy during deposition process. In ion plating processes, particles accelerate towards the substrate and arrive with energy levels up to hundreds of electron volts. These atoms sputter off some of the substrate material resulting in a cleaner, more adherent deposit. This "cleaning" process continues as the substrate is coated. The film growth is assured when the deposition rate is faster than the sputtering or cleaning rate. In general, high gas pressure results in greater scattering of the vapor and a more uniform deposit on the substrate.

An important variation on these processes involves the introduction of a gas such as oxygen or nitrogen into the chamber to form oxide or nitride deposits, respectively. These reactive deposition processes are used to deposit films of material such as titanium nitride, silicon dioxide, and aluminum oxide. Overall, PVD processes result in a thin, uniform coating that is much less likely to require machining after application. Additionally, the specifics of the aforementioned three variations of PVD processes are by no means exclusive. For example, some PVD processes use laser ablation or pulsed laser deposition to release a controlled amount of target material in the form of a gas. Accelerated plasma can also be used in the PVD process to deliver a heat pulse to a target to release a controlled amount of gaseous target material.

Forming A Target

Before a forcing method can be utilized, a target must be formed. There are several methods of forming the target material, including but not limited to vacuum melting and powder metallurgy. Types of target materials used dictate which method is chosen. Vacuum melting is most often used for metals with relatively low melting points. In this process, the materials are mixed, melted together, and poured into a mold in the vacuum furnace which aids in outgassing volatile constituents. After cooling, the resultant ingot is machined into its final target form. The target is then attached to a backing plate which holds the target in a PVD deposition chamber.

Materials having high melting points (e.g., tungsten, molybdenum) are best formed into targets using powder metallurgy. In this process, the materials are respectively ground into powders, mixed and poured into a mold. The powder mix is then sintered or compacted by high pressure and temperature to form a solid form ingot. The ingot is then machined to a final form and joined to a backing plate. Powder metallurgy has a disadvantage in that with a low density, potentially volatile gases trapped during formation are released by sputtering, which may additionally contaminate the resultant film.

Other materials may be formed into targets through growth methods, such as Czochralski growth method (CZ). In this method, a form is slowly extracted from a molten pool of the desired material using a seed crystal. The growth occurs through a combination of capillary action and epitaxial growth. This is generally used for materials suitable for CZ growth, such as but not limited to silicon, germanium, gallium, or alloys and/or compounds thereof.

Regardless of the method used to form the target, the material is shaped into a final target form (e.g., disk, cone, square) suited for use in a particular deposition chamber. However, some materials used in sputtering are very difficult to machine and several of these are very fragile. Shaping the target is a very important variable in providing a high quality film. Unfortunately, some of the conventional PVD processes, such as those utilizing lasers, ion beams, electron beams, or electromagnetic energy, typically result in uneven wear of the target due to non-uniform heating. Non-uniform heating generally relates to the conformation of the electromagnetic field surrounding a target and/or a target's internal temperature profile. Therefore, there is a real need in the industry for a target configuration which will help to avoid the problem of uneven wear of a target.

Use Of Backing Plates

It is common in the industry to bond the metal or metal alloy target to a backing plate. Typically, such a plate Is made from a metal or metal alloy (e.g., copper). An indium-based bonding technology is generally used to attach the target to the backing plate, creating a bonding interface. The backing plate is required in order to support the target in the chamber in which the sputtering takes place. Often, materials used to bond the target to the backing plate, or the backing plate itself, may contribute to contamination during the deposition process.

Prior Art Production Methods

In the current state of the art, planar silicon targets are produced primarily by slicing silicon boules across their diameter then machining a round tile (requiring two cuts) a or rectangular tile (requiring four more cuts) from the round cross-section. Each of the six sides of the rectangular tile or the circumference and the facing surfaces of a disc are machined. In some cases they are also ground and polished. This is a labor-and material-intensive method of production, which generates a fair amount of skeletal scrap. A real need exists for a processing method of a silicon target which is easily manufactured and resists the uneven wear (and therefore, potentially affected film quality) as described above.

SUMMARY OF THE INVENTION (DISCLOSURE OF THE INVENTION)

The present invention comprises a target-backing plate combination assembly, comprising a configuration wherein a target having a semi-circular face is joined with a correspondingly-shaped backing plate at a semi-circular bonding interface, as well as the process for producing the assembly.

The present invention comprises a target assembly for PVD comprising a target, wherein the target has a planar face and a geometrically-shaped face, a backing plate, wherein the plate has a depression formed in an upper surface of the plate conformed for fitting receipt of the geometrically-shaped target face, and a bonding interface joining said geometrically-shaped face and said depression. The geometrically-shaped face may comprise a geometric shape selected from the group consisting of circular, oval, ellipsoidal, triangular, square, rectangular, and polygonal. A geometrically-shaped face comprises a surface area greater than a surface area of a planar face.

The target of the assembly may comprise at least one material selected from the group comprising silicon, germanium, gallium, and alloys or compounds thereof. The backing plate may comprise at least one material selected from the group comprising of copper, molybdenum, stainless steel, aluminum, and alloys thereof.

The depression of the assembly may be formed by a method selected from the group consisting of molding, pressing, and machining. The target may be formed by slicing a pre-formed boule lengthwise.

The bonding interface of the assembly may comprise a bonding layer. A bonding layer may comprise at least one material selected from the group consisting of indium, silver-tin, silver-filled epoxy, pure tine, or other suitable low melting point or curing materials.

The target dissipates radially when subjected to sputtering processes.

The present invention also includes a method of producing a target assembly comprising the steps of providing a pre-formed boule; slicing the boule lengthwise, thereby creating a semi-circular. curved face and a planar face; providing a pre-formed backing plate having a depression in an upper surface conformed for receipt of the curved face of the sliced boule; and bonding the curved face of the sliced boule to the depression of the backing plate at a bonding interface.

The method of the invention may additionally include providing a backing plate that is pre-formed, including its depression, by molding, pressing, or machining. Additionally, the bonding method may comprise chemically bonding or heat bonding. The boule may be sliced multiple times to create multiple targets.

The boule of the method may comprise a geometrically-shaped cylinder instead of a circular cylinder, may be grown by the CZ growth method, and may comprise a material selected from the group consisting of silicon, germanium, gallium, and alloys or compounds thereof.

A primary object of the present invention is to provide a target which is less likely to exhibit uneven wear during a PVD process.

Another object of the present invention is to provide a target which is easily produced with fewer machining steps.

Yet another object of the present invention is to provide a target which dissipates more completely.

A primary advantage of the present invention is less wasted target material due to greater dissipation.

Another advantage of the present invention is less contamination in the resultant film.

Another advantage is the simplified machining process.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate one or more embodiments of the present invention and, together with the description, serve to explain the principles of the invention. The drawings are only for the purpose of Illustrating one or more preferred embodiments of the invention and are not to be construed as limiting the invention. In the drawings.

DESCRIPTION OF THE PREFERRED EMBODIMENTS (BEST MODES FOR CARRYING OUT THE INVENTION)

The present invention comprises a target-backing plate combination assembly, comprising a configuration wherein a target having a semi-circular face is joined with a correspondingly-shaped backing plate at a semi-circular bonding interface, as well as the process for producing the assembly.

Figure 1:
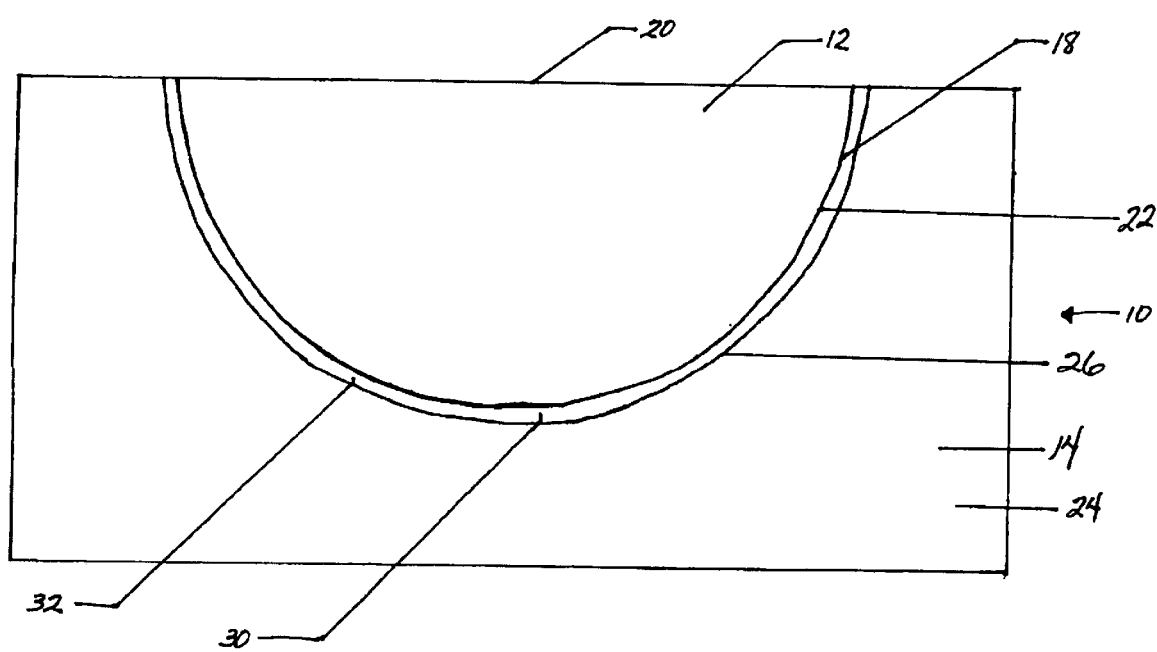
FIG. 1 is an end view of the combination of the present invention depicting the target and backing plate.

Turning now to the drawings, an end view of preferred backing plate-target combination assembly 10 of the present invention is depicted in FIG. 1. Assembly 10 comprises target 12 and backing plate 14.

In the preferred embodiment, to prepare target 12, cylindrically-shaped silicon boule 16 is sliced along its length one or more times, providing semi-circular boule length 18. In the preferred embodiment, boule 16 will be sliced only once, providing two equal hemispherical lengths 18, each having planar face 20. Length 18 comprises at least one planar face 20 and semi-circular or curved face 22. The boule is prepared by conventional methods known in the art, preferably, but not limited to CZ growth followed by cutting. A boule is preferably cut by diamond or laser cutting, and may be ground afterward, if necessary. In alternate embodiments, other cylindrical shapes comprising geometrically configured shapes may be utilized, including but not limited to ellipses, ovals, triangles, squares, rectangles, and polygons. While these boule shapes may be utilized in the present invention for target formation with a conformingly-shaped backing plate depression, the properties of the equally divided hemispherical boule length is preferred.

Backing plate 14 comprises base 24 and conforming semi-circular depression 26 formed within upper surface 28 of base 24. Backing plate 14 can be prepared from any known conventional method, including but not limited to pressing, molding, and machining. Backing plate 14 Is preferably comprised of copper, but may be comprised of any suitable material known in the art, including but not limited to molybdenum, stainless steel, aluminum, and alloys thereof.

Curved face 22 of each length 18 of target 12 is bonded at bonding interface 30 into correspondingly-shaped depression 26 of backing plate 14 at bonding interface 32. As a result of this bonding to form combination 10, preferably only one surface 20, is presentable to the plasma for forcing of target 12 material. Curved surface 22 is preferably entirely captive to depression 26 of backing plate 14 at bonding interface 30 in the preferred embodiment. However, alternate embodiments may comprise curved surfaces protruding from the depression. Preferably, bonding interface 30 comprises bonding layer 32 which provides electrical and thermal conductance to allow for higher deposition rate methods such as direct current (DC) or alternating current (AC) magnetron sputtering techniques, and preferably comprises indium, preferably in a molten state, but may comprise other or additional bonding materials, including but not limited to silver-tin, silver-filled epoxy, pure tin, or other suitable low melting point or curing materials. In alternate embodiments, bonding interface 30 may be formed by heat. Because the bond surface area of the target is greater than the planar surface area due to the curvature of the target, the electrical and thermal conductivity of this resulting product is beneficially greater than prior art targets which employ parallel surfaces of equal area. This Is beneficial as the total load that the assembly can manage is greater than prior art assemblies, given the present invention's greater ability to wick away heat. Immersion of greater than 50% of the surface area of the target yields lower current density and thermal load density per square inch.

Figure 2:
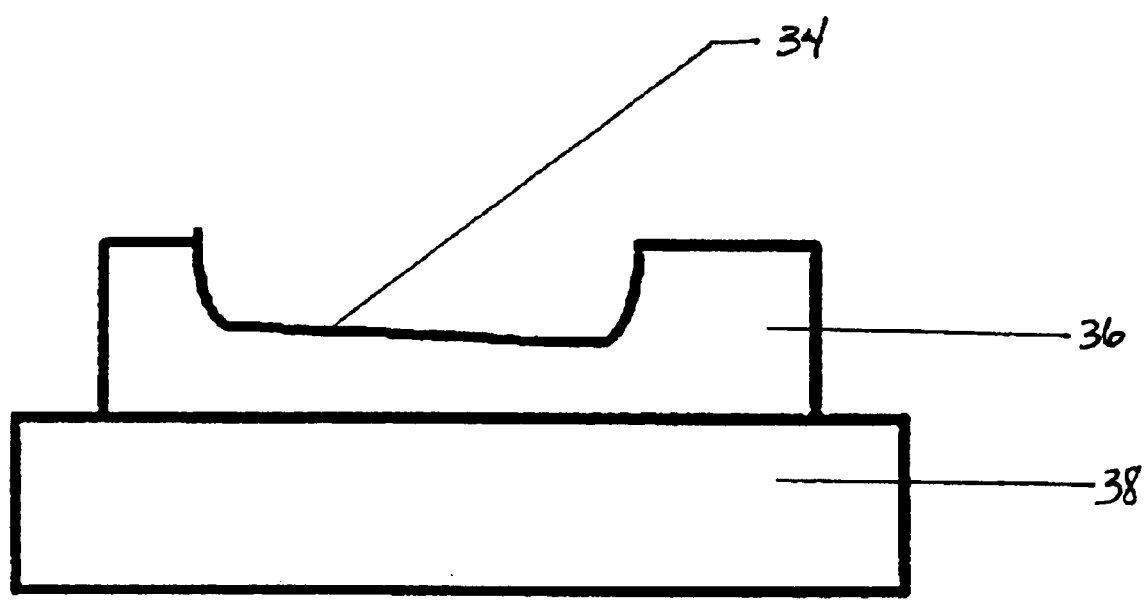
FIG. 2 is a magnetron diagram of uneven wearing of a prior art target during sputtering.

Typical magnetron erosion profiles, such as is illustrated in FIG. 2, show a non-uniform removal of target surface 34 of typical prior art target 36 bonded to backing plate 38. This trenching effect detrimentally limits current target yields up to approximately 30%. For materials such as silicon that have a very high processing cost with little residual scrap value, Increasing effective yield by using less material to accomplish the task is a significant benefit.

The manufacturing process of the silicon is also simplified. Instead of the manufacturing process to create a target as described in the Background section of this application (i.e., cutting a rectangular section from a circular cross-section of a silicon boule, whereby two cuts are made to make the circular slice and four additional cuts to create a rectangle), the present invention requires only slicing the boule lengthwise before bonding the target to the backing plate.

In the preferred method of the present invention, a silicon boule (e.g., CZ) is grown with a diameter chosen to create an appropriate target surface, target depth and yield. The boule is then ground on the diameter to create a smooth uniform surface and then cut lengthwise to create two or more sections. The target surface is the flat side. This is ground and optionally polished to provide a suitable surface to present to the plasma. The curved surface as shown in FIG. 1 is bonded with a bonding layer to a backing plate having a similar curvature to cradle the target.

As a result, less labor and machine time is required to shape the target prior to bonding. The curved target dissipates radially and more completely than prior art devices and also conducts electricity over a broader surface.

In alternate embodiments, materials forming a boule or ingot other than silicon may be used in accordance with the methods of the invention, including but not limited to germanium, gallium, or alloys or compounds thereof.

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A target assembly for PVD comprising:
   a target, wherein said target has a planar face and a semi-circular-shaped face;

a backing plate, wherein said plate has a depression in an upper surface of said plate conformed for fitting said semi-circular-shaped target face therein; and a bonding interface joining said semi-circular-shaped face and said depression.

2. The target assembly of claim 1 wherein said target comprises at least one material selected from the group consisting of silicon, germanium, gallium, alloys thereof, and compounds thereof.

3. The target assembly of claim 2 wherein said target material comprises silicon.

4. The target assembly of claim 1 wherein said semi-circular-shaped face comprises a geometric shape selected from the group consisting of circular, oval, and ellipsoidal.

5. The target assembly of claim 1 wherein said depression is formed by a method selected from the group consisting of molding, pressing, and machining.

6. The target assembly of claim 1 wherein said backing plate comprises at least one material selected from the group consisting of copper, stainless steel, aluminum, and alloys thereof.

7. The target assembly of claim 1 wherein said bonding interface comprises a bonding layer.

8. The target assembly of claim 7 wherein said bonding layer comprises at least one material selected from the group consisting of indium, silver-tin, silver-filled epoxy, pure tin, other low melting point materials, and other curable materials.

9. The target assembly of claim 1 wherein said target is formed by slicing a pre-formed boule lengthwise.

10. The target assembly of claim 1 wherein said target dissipates radially from said planar face to said semi-circular-shaped face to match a profile of said depression in said backing plate when subjected to a sputtering process.

11. The target assembly of claim 1 wherein said semi-circular shaped face comprises a surface area and said surface area is greater than a surface area of said planar face.

12. A method of producing a target assembly comprising the steps of:

providing a pre-formed boule;

slicing the boule lengthwise, thereby creating geometrically-shaped face and a planar face;

providing a backing plate;

providing a depression in an upper surface of the backing plate conformed for receipt of the curved face of the sliced boule; and bonding the curved face of the sliced boule to the depression of the backing plate at a bonding interface.

13. The method of claim 12 wherein the step of providing a backing plate comprises providing a backing plate pre-formed by molding, pressing, or machining.

14. The method of claim 12 wherein the step of bonding the curved surface comprises at least one process selected from the group consisting of chemical bonding and heat bonding.

15. The method of claim 12 wherein the slicing step comprises slicing the boule multiple times to create multiple targets.

16. The method of claim 12 wherein the step of providing a preformed boule comprises providing a boule comprising a geometrically-shaped cylinder.

17. The method of claim 16 wherein said geometrically-shaped cylinder comprises a geometric shape selected from the group consisting of circular, ellipse, oval, triangle, square, rectangle, and polygon.

18. The method of claim 12 wherein the step of providing a depression comprises a process selected from the group consisting of molding, pressing, and machining.

19. The method of claim 12 wherein the step of providing a pre-formed boule comprises growing the boule by a CZ growth method.

20. The method of claim 19 wherein the boule comprises a material selected from the group consisting of silicon, germanium, gallium, alloys thereof, and compounds thereof.

21. The method of claim 20 wherein said boule material comprises silicon.

* * * * *